(12) United States Patent
Webb

(10) Patent No.: US 6,188,709 B1
(45) Date of Patent: Feb. 13, 2001

(54) AERODYNAMIC ELECTRODE SUPPORT BAR

(75) Inventor: R. Kyle Webb, Escondido, CA (US)

(73) Assignee: Cymer, Inc., San Diego, CA (US)

( * ) Notice: Under 35 U.S.C. 154(b), the term of this patent shall be extended for 0 days.

(21) Appl. No.: 09/198,081

(22) Filed: Nov. 23, 1998

Related U.S. Application Data

(63) Continuation-in-part of application No. 09/157,067, filed on Sep. 18, 1998.

(51) Int. Cl.[7] ............................................. H01S 3/22
(52) U.S. Cl. ........................... 372/57; 372/38; 372/58; 372/55; 372/87
(58) Field of Search .................... 372/57, 58, 55, 372/86, 87, 38

(56) References Cited

U.S. PATENT DOCUMENTS

| | | | |
|---|---|---|---|
| 4,959,840 | | 9/1990 | Akins et al. ............................ 372/57 |
| 5,023,884 | * | 6/1991 | Akins et al. ............................ 372/57 |
| 5,029,177 | * | 7/1991 | Akins et al. ............................ 372/57 |
| 5,033,055 | * | 7/1991 | Akins et al. ............................ 372/57 |
| 5,048,041 | | 9/1991 | Akins et al. ............................ 372/57 |
| 5,313,481 | | 5/1994 | Cook et al. ............................. 372/37 |
| 5,315,611 | | 5/1994 | Ball et al. .............................. 372/56 |
| 5,337,330 | | 8/1994 | Larson .................................. 372/86 |
| 5,377,215 | * | 12/1994 | Das et al. ............................... 372/57 |
| 5,448,580 | | 9/1995 | Birx et al. .............................. 372/38 |
| 5,719,896 | | 2/1998 | Watson ................................. 372/86 |
| 5,771,258 | * | 6/1998 | Morton et al. .......................... 372/57 |
| 5,856,991 | * | 1/1999 | Ershov .................................. 372/57 |

* cited by examiner

Primary Examiner—Brian Healy
(74) Attorney, Agent, or Firm—John R. Ross, Esq.

(57) ABSTRACT

A support bar member for supporting an electrode member of a pulsed laser system is described. The support bar member includes an aerodynamic nose configured to reduce an aerodynamic load applied against a blower assembly of the laser system by the support bar member. The nose provides an aerodynamic cut-off region on the support bar member such that, when the blower assembly is operating, the blower assembly does not vibrate significantly.

18 Claims, 9 Drawing Sheets

AERODYNAMIC ELECTRODE SUPPORT BAR

RELATED APPLICATIONS

This application is a continuation-in-part of application Ser. No. 09/157,067, filed Sep. 18, 1998, pending, titled "Reliable, Modular, Production Quality Narrow-Band High Rep Rate Excimer Laser."

The following applications and patent are incorporated herein by reference: Ser. No. 09/041,474, filed Mar. 11, 1998, now U.S. Pat. No. 5,991,324, titled "Reliable, Modular, Production Quality Narrow-Band KrF Excimer Laser"; Ser. No. 09/034,870, filed Mar. 4, 1998, now U.S. Pat. No. 6,005,879, titled "Pulsed Energy Control for Excimer Laser"; Ser. No. 08/995,832, filed Dec. 22, 1997, now U.S. Pat. No. 5,982,795, titled "Excimer Laser Having Pulse Power Supply with Fine Digital Regulation"; Ser. No. 08/842,305, filed Apr. 23, 1997, now U.S. Pat. No. 5,835,520, titled "Very Narrow-band KrF Laser"; and U.S. Pat. No. 5,719,896, issued Feb. 17, 1998, titled "Low Cost Corona Preionizer for Laser."

FIELD OF THE INVENTION

This invention relates to laser systems and, more specifically, to a support bar for supporting an electrode member of the laser system.

BACKGROUND OF THE INVENTION

Pulsed laser systems, such as excimer lasers, are well known. FIG. 1 is an end cross sectional view of a laser chamber, generally illustrated as 10, used in a conventional pulsed laser system. The laser chamber 10 comprises a pair of electrode members 12, which include a cathode 14 and an anode 16. The area between the cathode 14 and the anode 16 is referred to as an electrical discharge area 18. A support bar member 20 supports the anode 16. A heat exchanger 22, and a blower assembly 24 are also disposed within the laser chamber 10. As is well known by those skilled in the art, the pulsed laser system produces energy pulses from a gas mixture in the electrical discharge area 18. The mixture of gas, which typically includes krypton and fluorine, is maintained at a high pressure (e.g., 3 atm.). The electrode members 12 ionize the gas mixture to produce a high energy discharge.

The blower assembly 24 plays the important role of circulating the gases in the laser chamber 10 of the pulsed laser system. The circulation of the gases has many purposes, including maintaining the temperature of the gases at the most efficient level of reaction, maximizing the life cycle of the gases, and facilitating the overall operation of the pulsed laser system.

The blower assembly 24 comprises a plurality of blades or vanes 26 which are driven in a clockwise direction, as indicated by arrow 28, for circulating the gases about the laser chamber 10. The directional flow of the gases, as indicated by arrows 30, is through the electrical discharge area 18, with a clockwise circulation about the heat exchanger 22, and through the blower assembly 24. The gases pass between the blades 26 of the blower assembly 24, as illustrated by the arrow 30.

The support bar member 20, configured to support the anode 16, includes a cut-off point, as indicated by numeral 21. The cut-off point 21 is a general region on the support bar member 20, located adjacent to the blower assembly 24, which defines the inlet side and the outlet side of the blower assembly 24.

Each time one of the blades 26 passes the cut-off point 21, the support bar member 20 applies an aerodynamic load to the blower assembly 24. The aerodynamic load agitates the blower assembly 24, causing the blower assembly 24 to vibrate. As the rotational speed of the blades 26 increases, so does the aerodynamic load, and, thus, the vibration of the blower assembly 24. The effect of the rotational speed of the blades 26, i.e., the blower speed, on the vibration of the blower assembly 24 is illustrated in FIG. 2. Curve A illustrates the vibration response in the range of 2500 to 4000 vibrations per minute corresponding to blower speeds of 2500 RPM to 4000 RPM. Curve B illustrates the vibrational response associated with twice the rotational speed, and curve C illustrates the vibrational response associated with 23 times the rotational speed (i.e., 23 vanes or blades 26).

Furthermore, the vibration of the blower assembly 24 is highly detrimental to our application due to the nature of beam stability as it travels through. In the past any reduction of rotating mass vibration was necessarily associated with blower speed reduction. Blower speed reduction results in gas flow reduction. Gas flow reduction disabled the function of the laser. The vibration reduces the output efficiency of the blower assembly 24 by about 10%. The vibration also increases the noise produced by the blower assembly 24. Moreover, the vibration causes deterioration and failure of the mechanical components of the blower assembly 24, such as the blower assembly's 24 bearing members, driver shaft, and other moving components. As a result, it would be advantageous to reduce the vibration of the blower assembly 24.

SUMMARY

An improved laser chamber is disclosed which does not suffer from the above-described drawbacks. The laser chamber has a pair of electrode members—an anode and a cathode—defining an electrical discharge area for producing a high energy discharge. The laser chamber includes a blower assembly for the proper circulation and the efficient flow of gases during the operation of the electrode members.

The laser chamber further includes a support bar member for supporting one of the electrode members, e.g., the anode. The support bar member comprises an aerodynamic nose configured to reduce an aerodynamic load that is applied against the blower assembly by the support bar member when the blower assembly is rotatably driven. As a result, the blower assembly does not vibrate significantly.

DESCRIPTION OF THE PREFERRED EMBODIMENTS

Figure 1:
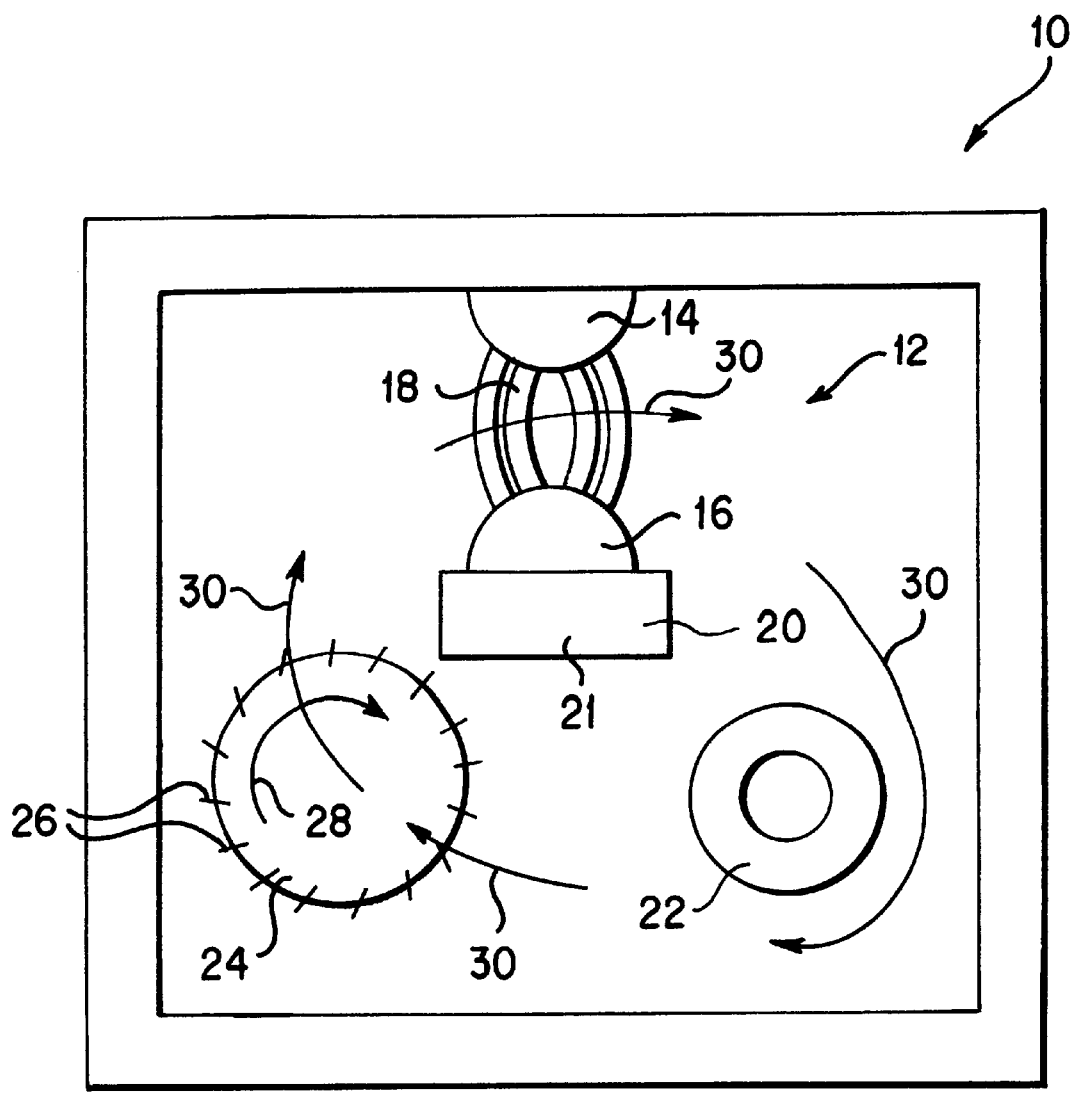
FIG. 1 is an end cross sectional view of a conventional laser chamber used in a pulsed laser system, including a conventional support bar member.

Referring in detail now to the drawings wherein similar parts of the present invention are represented by like reference numerals, there is seen in FIGS. 3–6 a laser chamber 40, similar to Excimer Laser Model 5000, produced by CYMER, Inc., San Diego, Calif. The laser chamber 40 is thoroughly disclosed in U.S. Pat. No. 4,959,840 to Akins et al., assigned to the assignee of the present invention, and incorporated herein by reference in its entirety as if repeated verbatim immediately hereinafter. The laser chamber 40 is formed by a pair of half-housing members, an upper housing member 42 and a lower housing member 44, coupled together and sealed. The coupled half-housing members 42 and 44 are, in essence, interconnected walls, collectively and/or individually illustrated as 46. The interconnected walls 46 define a laser cavity 48 which contains various components of the laser chamber 40. The walls 46 of the laser chamber 40 can be manufactured from any suitable material that is compatible with the specific gases (e.g., fluorine and krypton) used in the laser chamber 40, such as nickel plated aluminum, tin, monel, and gold.

Located within the laser cavity 48 are electrode members, generally illustrated as 50. The electrode members 50 include a cathode 52 and an anode 54, separated by a distance defining an electrical discharge area 56.

The cathode 52 and the anode 54 can be manufactured from any suitable high purity, insulated metal capable of resisting erosion so as to avoid contaminating the gases which are introduced into the laser cavity 48. For example, the electrode members 50 can be manufactured from brass insulated with a ceramic compound, such as alumina.

A support bar member 60, made from a suitable conducting material, supports the anode 54 with threaded rods 62. The support bar member 60 is structurally defined by a first side 64 (FIGS. 7–10), a second side 66 opposing the first side 64, and an aerodynamic nose 68 commonly extending from the first and second sides 64, 66. The nose 68 provides a means for reducing the vibration of a blower assembly 90, the details of which will be discussed later in the application.

Figure 3:
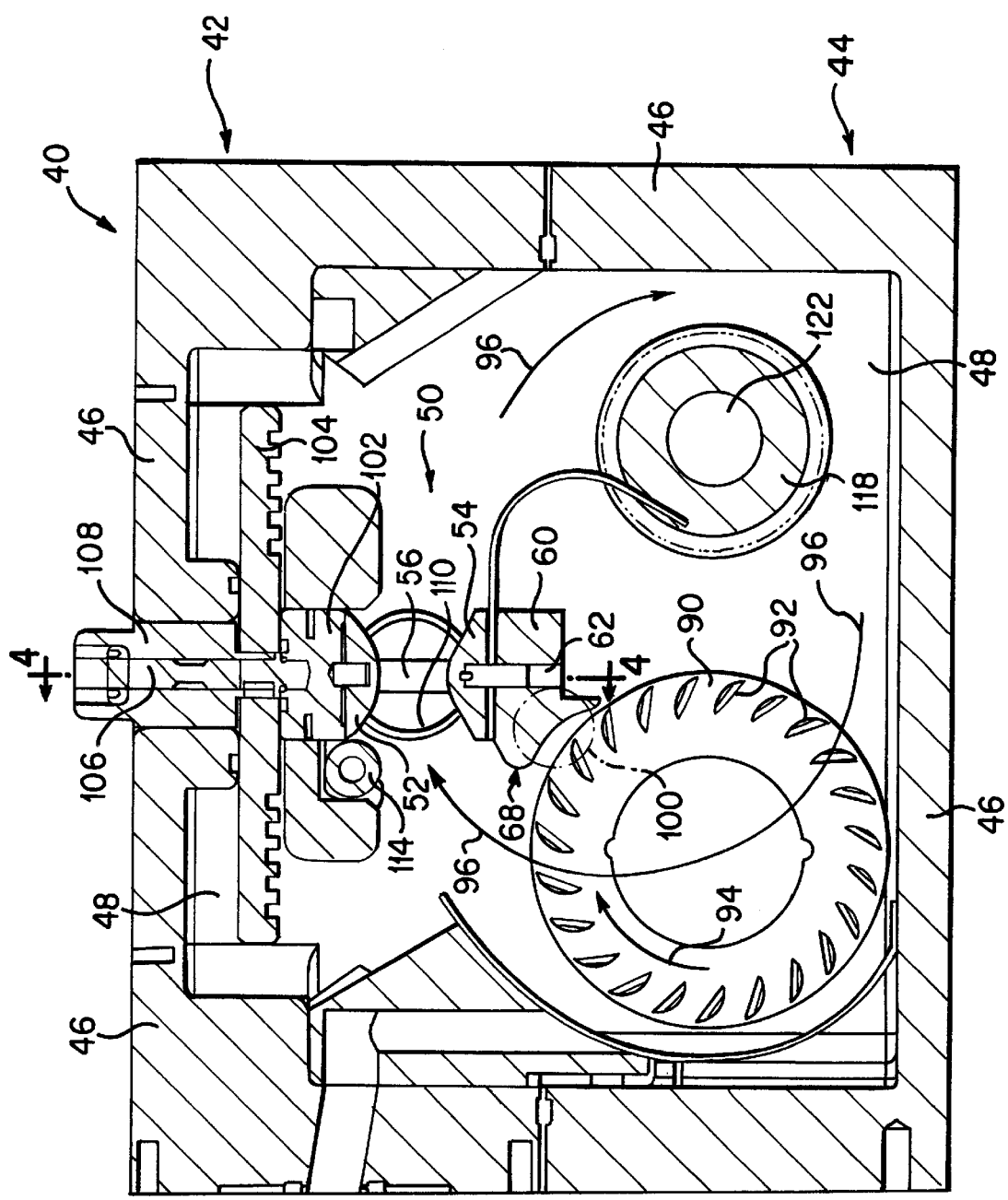
FIG. 3 is an end cross sectional view of a laser chamber used in a pulsed laser system, including the support bar member of the present invention configured to support an electrode member.
Figure 7:
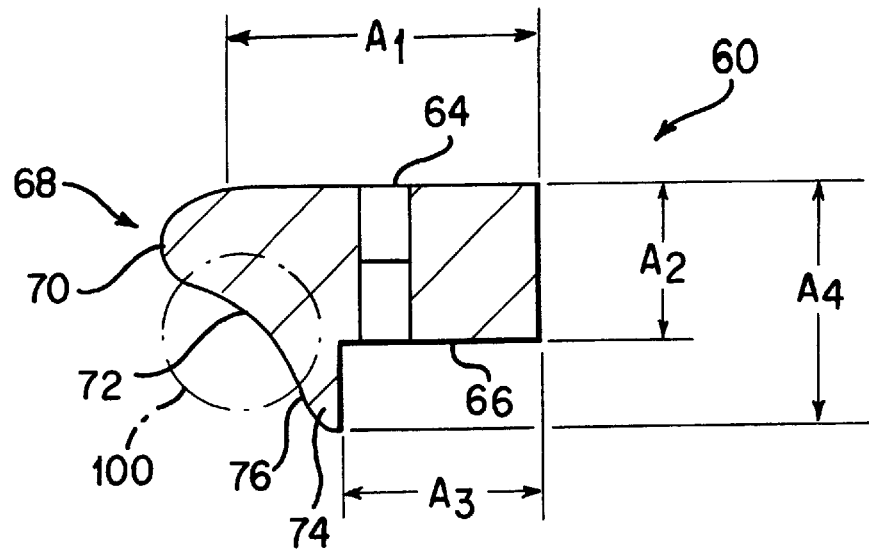
FIGS. 7–12 are end cross sectional views of various embodiments of the support bar member of the present invention.

In a first embodiment, as illustrated by the end cross sectional view of FIGS. 3 and 7, the nose 68 is structurally defined by a generally convex wall 70 (FIG. 7) extending into a generally concave wall 72. A lip 74 protrudes from the second side 66 of the support bar member 60. The lip 74 comprises a lip wall 76 that is in common with and extending from the concave wall 72. Illustrative dimensional specifications for the support bar member 60, including the nose 68, shown in FIGS. 3 and 7 are provided in Table I below:

TABLE I

|  | mm | inches |
| --- | --- | --- |
| $A_1$ | 30.50 | 1.201 |
| $A_2$ | 15.90 | 0.626 |
| $A_3$ | 19.76 | 0.778 |
| $A_4$ | 24.90 | 0.980 |

Figure 8:
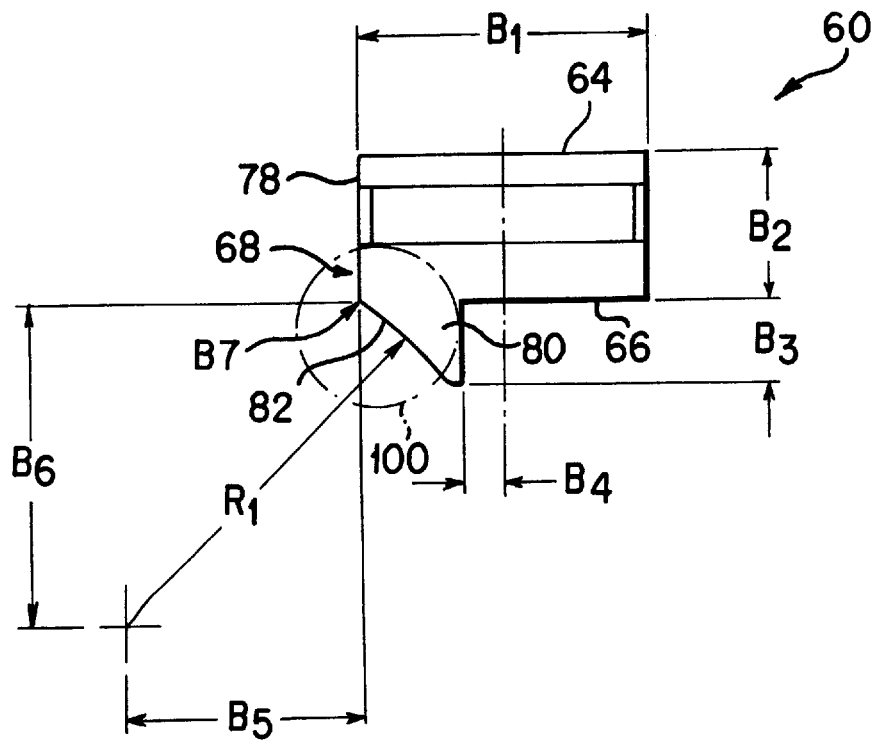

In a second embodiment, as illustrated by FIG. 8, the nose 68 is structurally defined, as illustrated in the end cross sectional view, by a planar wall 78 and a lip 80 protruding from the second side 66 of the support bar member 60. The lip 80 has a lip wall 82 that is in common with and extending from the planar wall 78. The lip wall 82 is geometrically defined by a radius of curvature, indicated by $R_1$. Illustrative dimensional specifications for the support bar member 60, including the nose 68, shown in FIG. 8, are provided in Table II below:

TABLE II

|  | mm | inches |
| --- | --- | --- |
| $B_1$ | 30.50 | 1.201 |
| $B_2$ | 15.90 | 0.626 |
| $B_3$ | 9.00 | 0.354 |
| $B_4$ | 4.50 | 0.177 |
| $B_5$ | 25.40 | 1.000 |
| $B_6$ | 35.03 | 1.379 |
| $B_7$ | 0.76 | 0.030 |
| $R_1$ | 43.43 | 1.710 |

Figure 9:
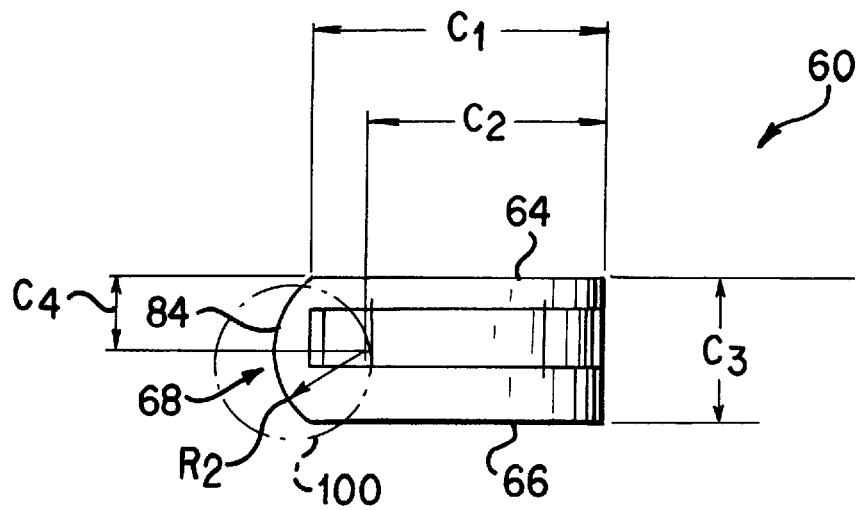

Referring to FIG. 9 for the third embodiment, the nose 68 is structurally defined, as illustrated in the end cross sectional view, by a generally convex wall 84 having a radius of curvature $R_2$. Illustrative dimensional specifications for the support bar member 60, including the nose 68, shown in FIG. 9, are provided in Table III below:

TABLE III

|  | mm | inches |
| --- | --- | --- |
| $C_1$ | 30.50 | 1.201 |
| $C_2$ | 24.74 | 0.974 |
| $C_3$ | 15.90 | 0.626 |
| $C_4$ | 7.95 | 0.313 |
| $R_2$ | 9.82 | 0.387 |

Figure 10:
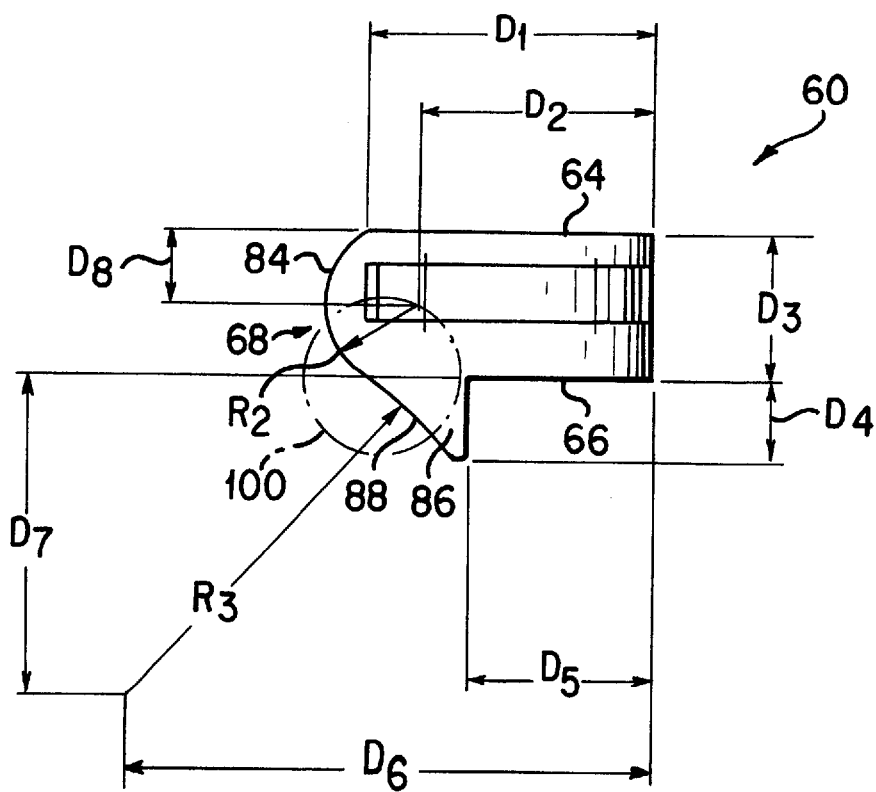

The fourth embodiment is similar to the third embodiment but for the inclusion of a lip 86. As illustrated in FIG. 10, the lip 86 protrudes from the second side 66 of the support bar member 60. The lip 86 comprises a lip wall 88 that is in common with and extending from the convex wall 84. The lip wall 88 is geometrically defined by a radius of curvature, as illustrated by $R_3$. Illustrative dimensional specifications for the support bar member 60, including the nose 68, shown in FIG. 10, are provided in Table IV below:

TABLE IV

|  | mm | inches |
| --- | --- | --- |
| $D_1$ | 30.50 | 1.201 |
| $D_2$ | 24.74 | 0.974 |
| $D_3$ | 15.90 | 0.626 |
| $D_4$ | 9.00 | 0.354 |
| $D_5$ | 19.76 | 0.778 |
| $D_6$ | 55.90 | 2.201 |

TABLE IV-continued

|  | mm | inches |
|---|---|---|
| $D_7$ | 35.03 | 1.379 |
| $D_8$ | 7.95 | 0.313 |
| $R_2$ | 9.82 | 0.387 |
| $R_3$ | 43.27 | 1.704 |

Figure 11:
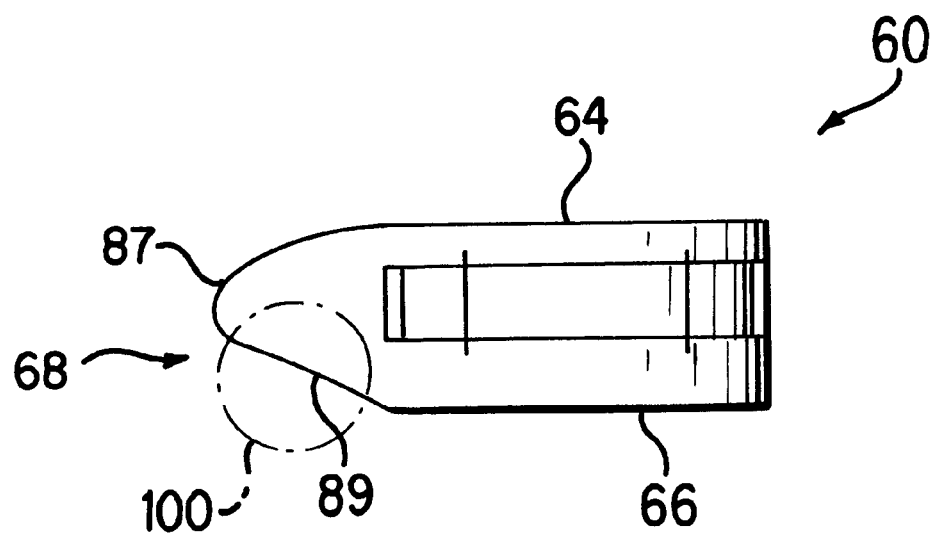
Figure 12:
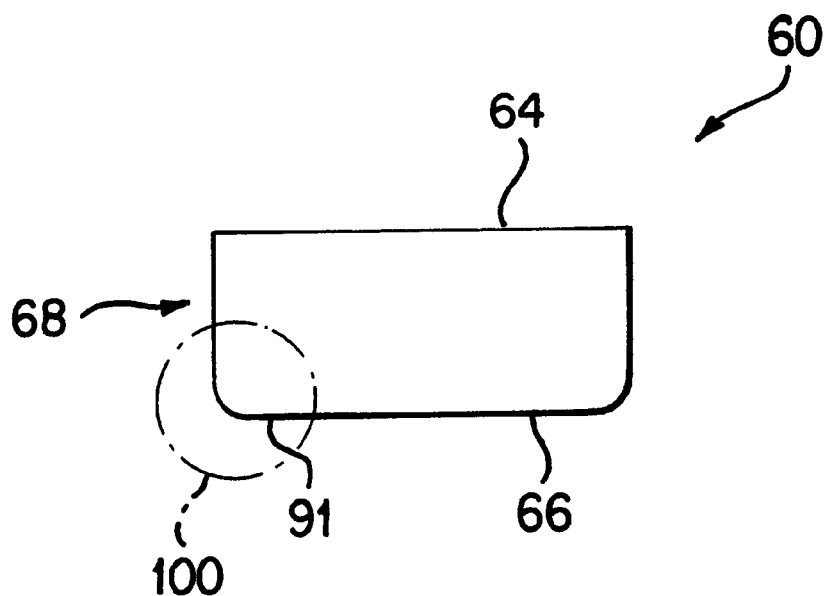

It should be understood that other structural and geometrical designs of the nose 68 can be implemented in the support bar member 60 of the present invention, examples of which are illustrated in FIGS. 11 and 12. FIG. 11 shows the nose 68 being structurally defined by a protruding wall 87 tapering into a generally concave wall 89 towards the second side 66. FIG. 12 shows the nose 68 being structurally defined by a rounded corner 91.

It should be further understood that the above-given values or dimensions are only illustrative and not limiting such that other dimensions can be used for the support bar member 60 and the nose 68 of the present invention.

Referring to FIG. 3, the blower assembly 90, provides for the proper circulation and efficient flow of gases during the operation of the laser chamber 40. The blower assembly 90 is described in application Ser. No. 09/141,068, Cymer docket number 97-0055-1, to Kyle Webb, entitled "A Blower Assembly For a Pulsed Laser System Incorporating Ceramic Bearings," assigned to the assignee of the present invention and incorporated herein by reference in its entirety as if repeated verbatim immediately hereinafter.

The blower assembly 90 comprises a plurality of blades or vanes (e.g., 23 blades) 92 which are driven in a clockwise direction 94 for circulating the gases about the laser cavity 48. The flow of the gases is illustrated by arrows 96.

The nose 68 provides an enlarged, aerodynamic area on the support bar member 60 which would have otherwise defined the cut-off point 21 of FIG. 1. The nose 68, by including the aforementioned geometrical shapes of FIGS. 7–11, in effect, enlarges the cut-off point 21 to an aerodynamic cut-off region (i.e., a general region on the support bar member 60 which defines the inlet side and the outlet side of the blower assembly 90), as indicated by encircled area 100 in FIGS. 3 and 7–11. The modification of the prior art cut-off point 21 (FIG. 1) to a cut-off region 100 reduces the aerodynamic load that the support bar member 60 applies to the blower assembly 90. Accordingly, the blower assembly 90 does not vibrate significantly.

Figure 2:
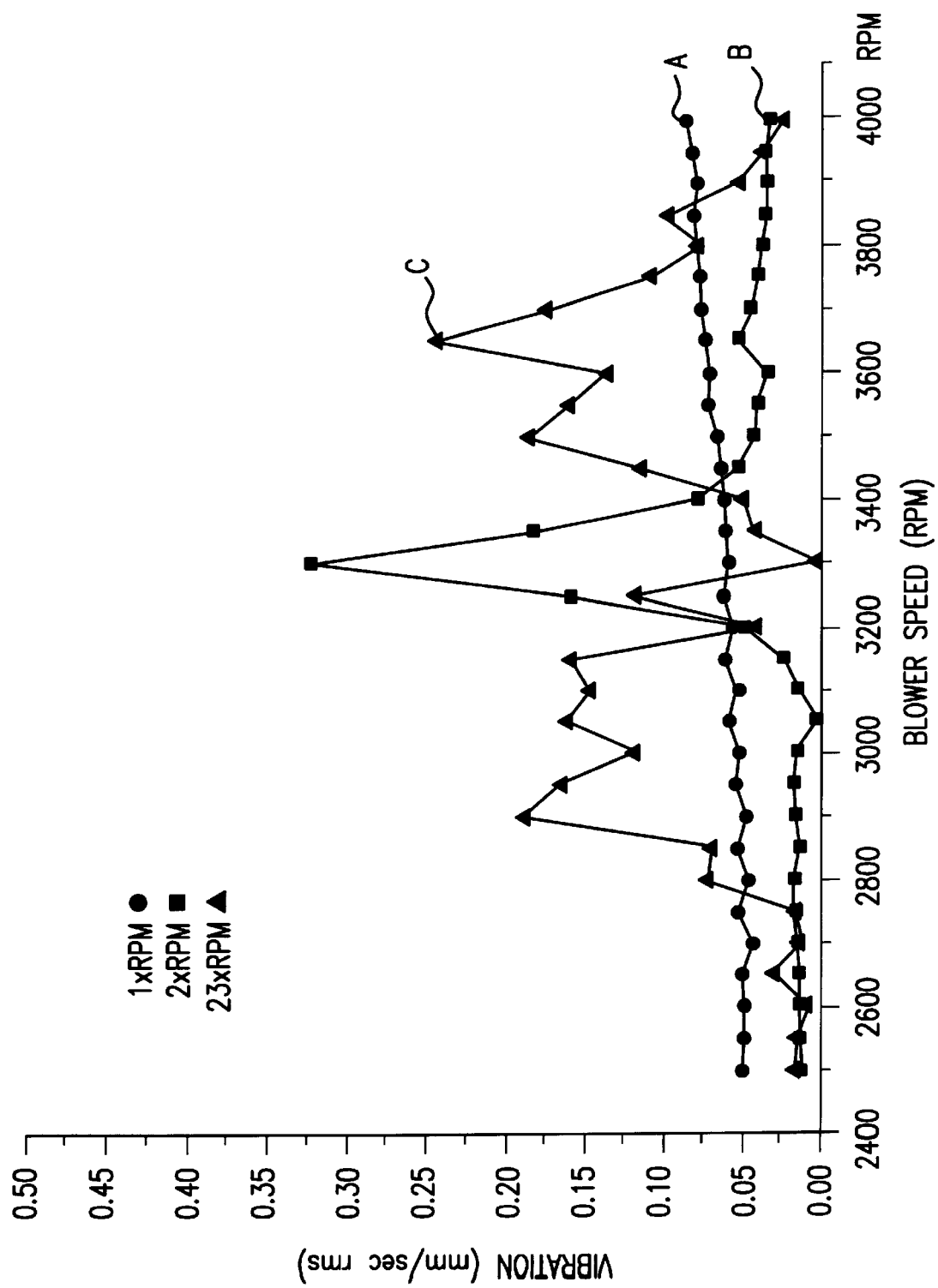
FIG. 2 is a graph illustrating the vibration of a blower assembly of the pulsed laser system versus blower speed, the vibration being caused by an aerodynamic load applied to the blower assembly by the conventional support bar member.
Figure 13:
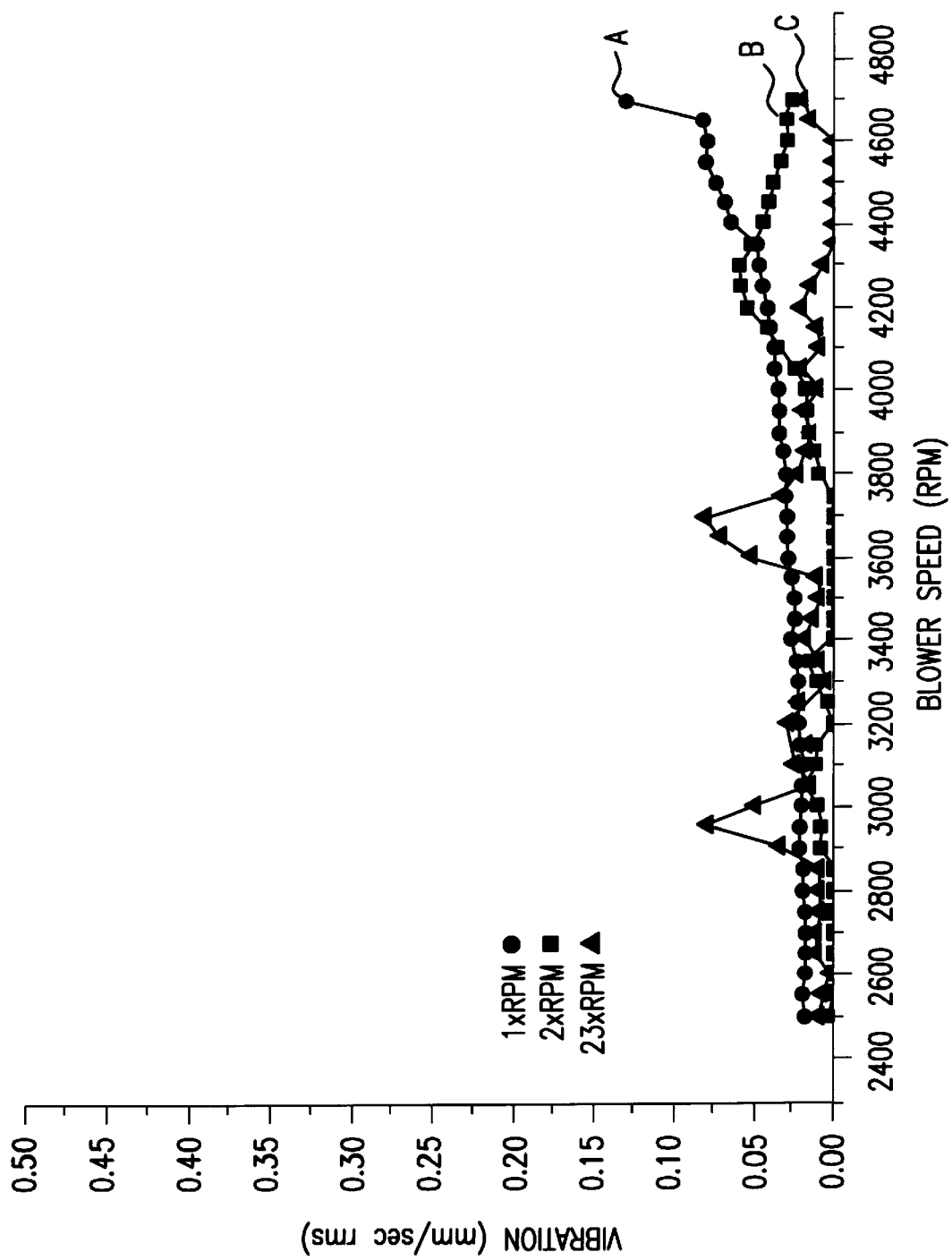
FIG. 13 is a graph illustrating the reduced vibration of a blower assembly of the pulsed laser system versus blower speed, the vibration being caused by an aerodynamic load applied to the blower assembly by the support bar member of the present invention.

FIG. 13 is a graph illustrating the vibration of the blower assembly 90 when the nose 68 is employed. Curve A illustrates the magnitude of vibration of the blower assembly 90 corresponding to blower speeds of 2500 RPM to 4700 RPM. Curve B illustrates the magnitude of vibration at twice the rotational speed, and curve C illustrates the magnitude of vibration at 23 times the rotational speed (i.e., 23 blades or vanes 92). The maximum amount of vibration of the blower assembly 90 is about 0.14 mm/sec rms, which is 0.185 mm/sec rms less than the maximum vibration caused by the conventional support bar member 20 (see FIG. 2 for a comparison).

Referring again to FIG. 3, a spacer member 102 contacts the cathode 52. The spacer member 102 is disposed adjacent to a main insulator 104. The main insulator 104 separates and insulates high voltage connectors 106 from one another. The high voltage connectors 106 engage the spacer member 102 to introduce a high voltage to the cathode 52. The high voltage connectors 106 extend through insulating bushings 108, which are made from any suitable material including ceramics or plastics.

Figure 4:
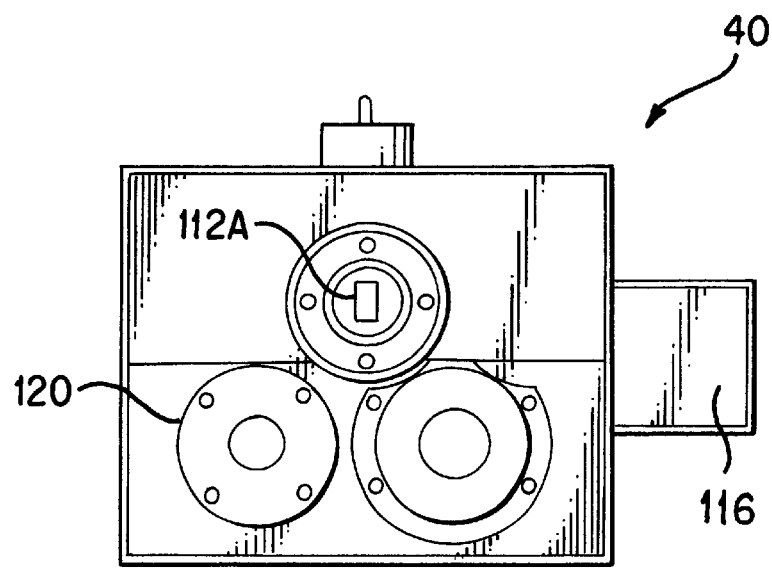
FIG. 4 is an exterior, elevational view of one end of the laser chamber of FIG. 3.
Figure 5:
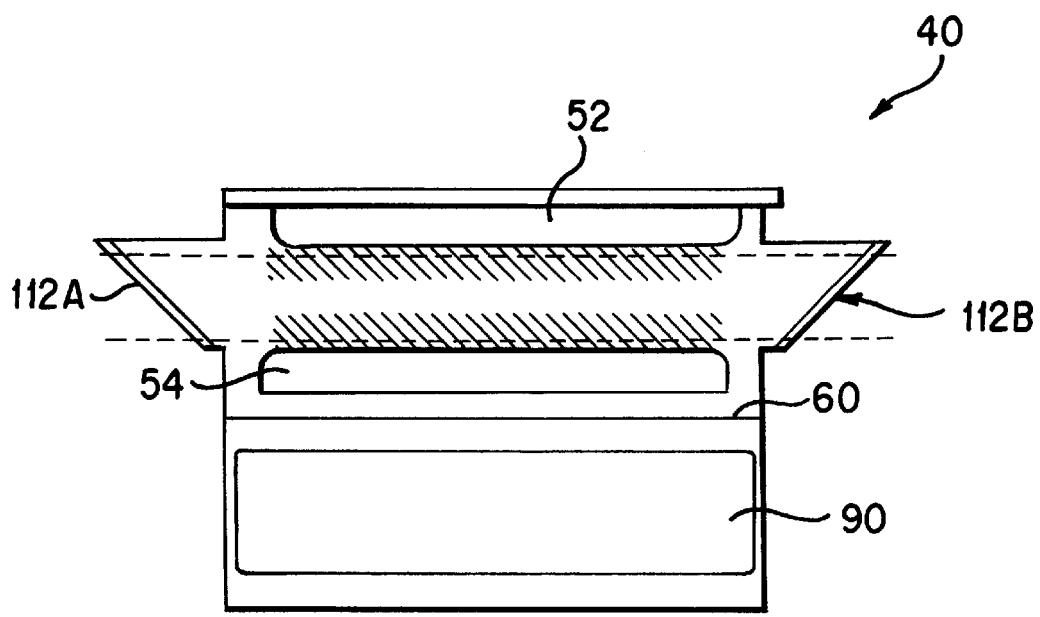
FIG. 5 is a schematic, side cross sectional view of the laser chamber of FIG. 3.
Figure 6:
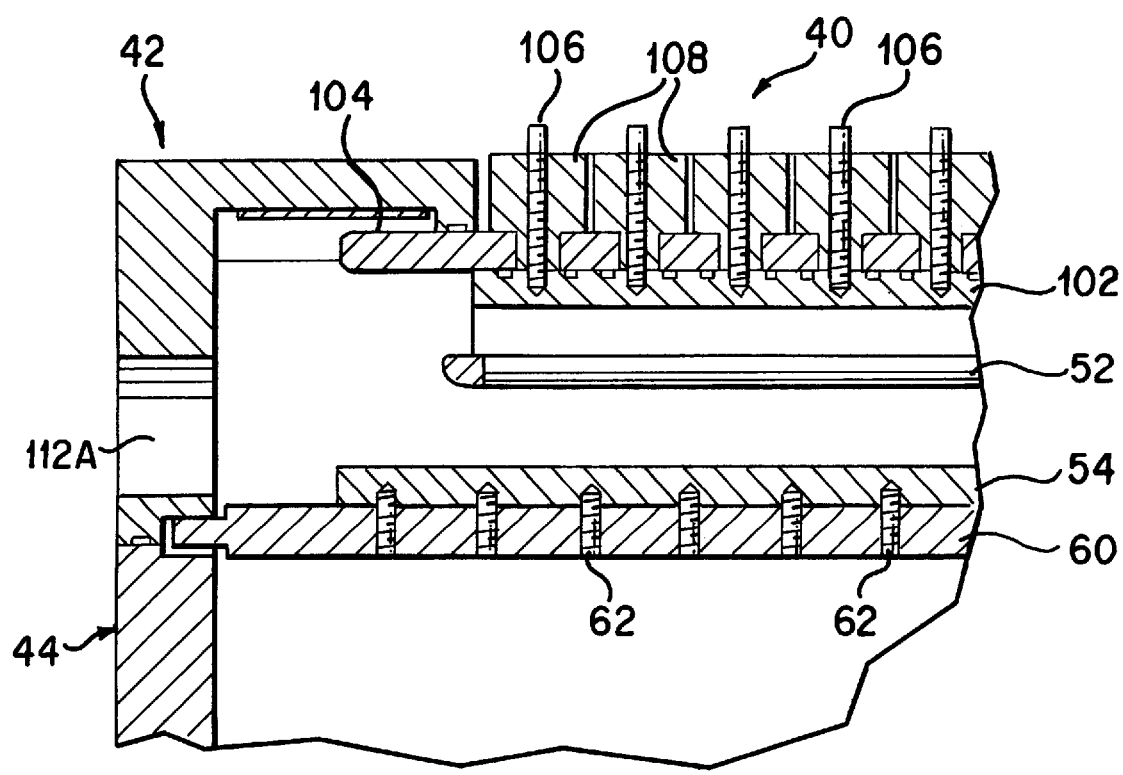
FIG. 6 is a partial, side cross sectional view of the laser chamber, taken in the direction of the arrows and along the plane of line 4—4 of FIG. 3.

A high energy discharge can be produced in the electrical discharge area 56 by the application of a high voltage, e.g., 20 kilovolts, to the cathode 52. More specifically, the application of a high voltage to the cathode 52 through the high voltage connectors 106 and the spacer member 102 produces the high energy discharge in the electrical discharge area 56. The high energy discharge ionizes the gases, illustrated by the shaded region 110, in the vicinity of the electrical discharge area 56 and causes these gases to react chemically. For example, the gases may include a mixture of krypton (Kr) and fluorine ($F_2$), which chemically react to produce KrF. The formation of KrF produces an energy radiation in a very narrow band of wavelengths such as in the excimer range. Referring to FIGS. 4 and 5, the energy radiation is directed to an optical element 112A (e.g., a window) at one end and to a corresponding optical element 112B at an opposing end. The energy radiation is reflected between the opposing optical elements 112A and 112B and is reinforced in each reflection. A portion of the energy radiation moving in each cycle between the opposing optical elements 112A and 112B passes through one of the optical elements such as the optical element 112A.

Pre-ionizers, generally illustrated as 114 can be disposed in the laser cavity 48 to facilitate the ionization of the gases, the details of which are included in U.S. Pat. No. 5,337,330 to Larson, assigned to the assignee of the present invention and fully incorporated herein by reference in its entirety as if repeated verbatim immediately hereinafter.

The laser chamber 40, moreover, can include a gas scoop (omitted from the Figures) for allowing a portion of the gases circulating about the laser cavity 48 to be siphoned for filtering by a filter 116, as illustrated in FIG. 4. The filter 116 can be an electrostatic precipitator, the details of which are described in U.S. Pat. No. 5,048,041 to Akins et al., assigned to the assignees of the present invention and fully incorporated herein by reference in its entirety as if repeated verbatim immediately hereinafter.

The high energy discharge produces a large amount of local heating in the gases. Accordingly, a heat exchanger 118 is disposed within the laser cavity 48 to decrease the temperature of the gases. The heat exchanger 118 is supported on the walls 46 of the laser chamber 40 by end caps, one of which is illustrated as 120 in FIG. 4. A fluid coolant is introduced through conduit 122 of the heat exchanger 118 to cool the circulating gases.

While particular embodiments of the present invention has been shown and described, it will be obvious to those skilled in the art that changes and modifications can be made without departing from this invention in its broader aspects and, therefore, the appended claims are to encompass within their scope all such changes and modifications as fall with the true spirit and scope of the this invention.

What is claimed is:

1. A laser apparatus, comprising:
   a) a laser chamber having interconnected walls defining a laser cavity inside said laser chamber, said laser cavity housing gases;
   b) a blower assembly disposed in said laser cavity for circulating said gases;
   c) a pair of electrode members disposed in said laser cavity; and
   d) a support bar member configured to support one of said electrode members, said support bar member having a cut-off region configured to reduce vibration of said blower assembly.

2. The laser apparatus of claim 1, wherein said cut-off region comprises a lip protruding from said support bar member.

3. The laser apparatus of claim 2, wherein said lip comprises a lip wall having a radius of curvature.

4. The laser apparatus of claim 1, wherein said cut-off region comprises a generally convex wall defining a side of said support bar member.

5. The laser apparatus of claim 4, wherein said cut-off region additionally comprises a lip protruding from said support bar member.

6. The laser apparatus of claim 5, wherein said lip comprises a lip wall extending from and being in common with said generally convex wall, said lip wall having a radius of curvature.

7. The laser apparatus of claim 1, wherein said cut-off region comprises a generally convex wall extending into a generally concave wall, said concave and convex walls defining a side of said support bar member.

8. The laser apparatus of claim 7, wherein said cut-off region additionally comprises a lip protruding from said support bar member, said lip having a lip wall extending from and being in common with said generally concave wall.

9. A support bar member for supporting an electrode member of a laser apparatus, comprising:
   a) a first side configured to support said electrode member of said laser apparatus;
   b) a second side opposing said first side; and
   c) an aerodynamic nose extending from said first and second sides.

10. The support bar member of claim 9, wherein said aerodynamic nose is defined by a planar wall and a lip protruding from said second side, said lip having a lip wall being in common with and extending from said planar wall.

11. The support bar member of claim 10, wherein said lip wall is geometrically defined by a radius of curvature.

12. The support bar member of claim 9, wherein said aerodynamic nose is defined by a generally convex wall.

13. The support bar member of claim 12, wherein said aerodynamic nose additionally comprises a lip protruding from said second side, said lip having a lip wall extending from and being in common with said convex wall.

14. The support bar member of claim 13, wherein said lip wall is geometrically defined by a radius of curvature.

15. The support bar member of claim 9, wherein said aerodynamic nose is defined by a generally convex wall extending into a generally concave wall.

16. The support bar member of claim 15, wherein said aerodynamic nose additionally comprises a lip protruding from said second side, said lip having a lip wall extending from and being in common with said concave wall.

17. A method for circulating gases in a laser chamber, said laser chamber including a blower assembly and a pair of electrode members, comprising:
   a) providing a support bar member configured to support one of said electrode members, said support bar member comprising an aerodynamic nose; and
   b) driving said blower assembly to circulate gases in said laser chamber, said gases flowing across said aerodynamic nose, whereby said support bar member does not significantly vibrate said blower assembly.

18. The method of claim 17, wherein said support bar member does not apply any significant aerodynamic load to said blower assembly.

* * * * *